United States Patent
Amanapu et al.

(10) Patent No.: US 10,818,589 B2
(45) Date of Patent: Oct. 27, 2020

(54) METAL INTERCONNECT STRUCTURES WITH SELF-FORMING SIDEWALL BARRIER LAYER

(71) Applicant: International Business Machines Corporation, Armonk, NY (US)

(72) Inventors: Hari Prasad Amanapu, Guilderland, NY (US); Cornelius Brown Peethala, Slingerlands, NY (US); Raghuveer Patiolla, Guilderland, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/352,452

(22) Filed: Mar. 13, 2019

(65) Prior Publication Data
US 2020/0294911 A1    Sep. 17, 2020

(51) Int. Cl.
*H01L 23/532* (2006.01)
*H01L 23/522* (2006.01)

(52) U.S. Cl.
CPC .... *H01L 23/5226* (2013.01); *H01L 23/53223* (2013.01); *H01L 23/53266* (2013.01)

(58) Field of Classification Search
CPC ........... H01L 23/5226; H01L 23/53223; H01L 23/53266
See application file for complete search history.

(56) References Cited

U.S. PATENT DOCUMENTS

| | | | |
|---|---|---|---|
| 6,664,185 B1 | 12/2003 | Wang et al. | |
| 9,190,321 B2 | 11/2015 | Cabral, Jr. et al. | |
| 9,514,983 B2 | 12/2016 | Jezewski et al. | |
| 2009/0263965 A1 | 10/2009 | Gordon et al. | |
| 2013/0320544 A1 | 12/2013 | Lin et al. | |
| 2014/0084466 A1 | 3/2014 | Matsumoto et al. | |
| 2015/0179579 A1 | 6/2015 | Jezewski et al. | |
| 2015/0194384 A1 | 7/2015 | Yu et al. | |
| 2017/0133325 A1 | 5/2017 | Chae et al. | |
| 2017/0236749 A1 | 8/2017 | Briggs et al. | |
| 2018/0211873 A1* | 7/2018 | Witt | H01L 21/76877 |

OTHER PUBLICATIONS

V. Kamineni et al., "Tungsten and Cobalt Metallization: A Material Study for MOL Local Interconnects," 2016 IEEE International Interconnect Technology Conference/Advanced Metallization Conference (IITC/AMC) pp. 105-107 (May 2016).
Anonymous, "RuMn Alloy CVD, ALD", IPCOM000223304D, Nov. 15, 2012 (2 pages).

* cited by examiner

*Primary Examiner* — David Vu
(74) *Attorney, Agent, or Firm* — James Nock; Michael J. Chang, LLC

(57) ABSTRACT

BEOL and MOL interconnect structures with a self-forming sidewall barrier layer are provided. In one aspect, a method of forming an interconnect structure includes: patterning a feature(s) in a dielectric; selectively forming a metal layer at a bottom of the at least one feature; depositing a liner layer lining the feature(s), wherein the conformal liner layer includes a metal alloy AB; depositing a metal onto the liner layer to form the interconnect structure; and annealing the interconnect structure under conditions sufficient to form a barrier layer including the component B along vertical sidewalls of the feature(s). A method of forming an interconnect structure including a via and a trench on top of the via is also provided, as is an interconnect structure.

18 Claims, 7 Drawing Sheets

METAL INTERCONNECT STRUCTURES WITH SELF-FORMING SIDEWALL BARRIER LAYER

FIELD OF THE INVENTION

The present invention relates to back-end-of-line (BEOL) and middle-of-line (MOL) interconnect structures, and more particularly, to BEOL and MOL interconnect structures with a self-forming sidewall barrier layer.

BACKGROUND OF THE INVENTION

Interconnect and contact metallization beyond conventional copper (Cu) is needed. Namely, at reduced dimensions, the resistance of Cu interconnects increases exponentially. Therefore, new barrier/metallization combinations are needed to reduce interconnect and contact resistance.

In the back-end-of-line (BEOL), cobalt (Co) and ruthenium (Ru) interconnects are being evaluated as an alternative to Cu. However, these structures still employ a conventional barrier/adhesion material such as titanium nitride (TiN) and/or tantalum nitride (TaN), which limits the space available for the interconnect metal. At scaled dimensions, this can result in an overly high resistance.

Therefore, improved interconnect and contact structures and techniques for fabrication thereof would be desirable.

SUMMARY OF THE INVENTION

The present invention provides back-end-of-line (BEOL) and middle-of-line (MOL) interconnect structures with a self-forming sidewall barrier layer. In one aspect of the invention, a method of forming an interconnect structure is provided. The method includes: patterning at least one feature in a dielectric; selectively forming a metal layer on horizontal surfaces, including at a bottom of the at least one feature; depositing a conformal liner layer into, and lining, the at least one feature that is in direct contact with the dielectric along vertical sidewalls of the at least one feature, wherein the conformal liner layer includes a metal alloy AB, wherein component A is selected from: cobalt (Co), ruthenium (Ru) iridium (Ir), rhodium (Rh), nickel (Ni), tungsten (W), platinum (Pt), and combinations thereof, and wherein component B is selected from: manganese (Mn), aluminum (Al), and combinations thereof; depositing a metal onto the conformal liner layer, filling the at least one feature, to form the interconnect structure in the at least one feature, wherein the metal includes at least one metal M selected from: Co, Ru, Ir, Rh, Ni, W, Pt, and combinations thereof; and annealing the interconnect structure under conditions sufficient to form a barrier layer including the component B along the vertical sidewalls of the at least one feature by diffusing the component B from the conformal liner layer to a sidewall interface between the interconnect structure and the dielectric.

In another aspect of the invention, another method of forming an interconnect structure is provided. The method includes: patterning at least one feature in a dielectric, wherein the at least one feature includes a via and a trench, on top of the via, aligned with the via; selectively forming a metal layer on horizontal surfaces, including at bottoms of the via and the trench; depositing a conformal liner layer into the at least one feature, lining the via and the trench, that is in direct contact with the dielectric along vertical sidewalls of the via and the trench, wherein the conformal liner layer includes a metal alloy AB, wherein component A is selected from: Co, Ru, Ir, Rh, Ni, W, Pt, and combinations thereof, and wherein component B is selected from: Mn, Al, and combinations thereof; depositing a metal onto the conformal liner layer, filling the via and the trench, to form the interconnect structure in the at least one feature including a contact in the via and a metal line in the trench, wherein the metal includes at least one metal M selected from: Co, Ru, Ir, Rh, Ni, W, Pt, and combinations thereof; and annealing the interconnect structure under conditions sufficient to form a barrier layer including the component B along the vertical sidewalls of the at least one feature by diffusing the component B from the conformal liner layer to a sidewall interface between the contact and the metal line and the dielectric.

In yet another aspect of the invention, an interconnect structure is provided. The interconnect structure includes: at least one feature patterned in a dielectric; a metal layer disposed only at a bottom of the at least one feature; a metal filling the at least one feature that forms the interconnect structure in the at least one feature, wherein the metal includes at least one metal M selected from: Co, Ru, Ir, Rh, Ni, W, Pt, and combinations thereof; and a barrier layer along the vertical sidewalls, wherein the barrier layer includes manganese silicate (MnSixOy) or aluminum silicate (AlSixOy).

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for forming back-end-of-line (BEOL) and middle-of-line (MOL) metal interconnect structures (e.g., contact via and/or metal line) structures employing a self-forming barrier along the interconnect structure sidewall. A different material (e.g., tantalum nitride (TaN) and/or titanium nitride (TiN)) can be employed at the interconnect structure bottom to provide an electromigration (EM) blocking boundary/diffusion barrier, when needed. Use of the present self-forming barrier along the sidewalls increases the metal volume for fill. An increase in the metal volume advantageously lowers the resistance.

Figure 1:
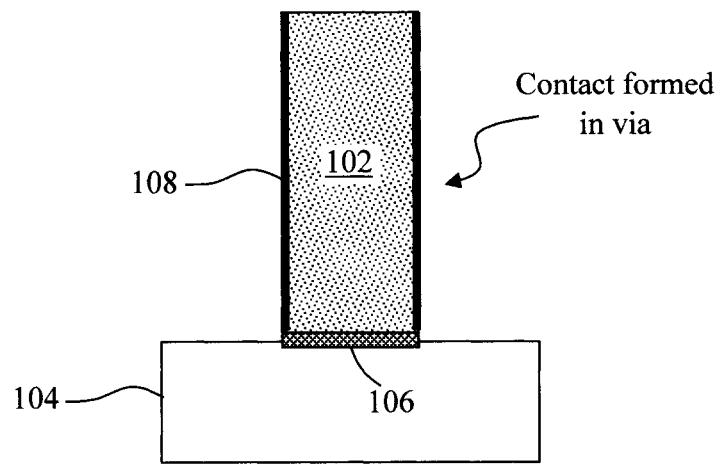
FIG. 1 is a cross-sectional diagram illustrating a contact formed in a via having an electromigration (EM) blocking boundary formed on the via bottom and a self-forming barrier formed along the sidewalls of the via according to an embodiment of the present invention.

The techniques provided herein apply to the formation of any type of metal interconnect structures such as contacts, metal lines, etc. For contacts, such as contact 102 formed in a via as shown in FIG. 1, electrons pass through the via bottom, e.g., to an underlying device(s) 104. In that case, an EM blocking boundary 106 can be formed on the via bottom using metals such as TaN and/or TiN. Along the sidewalls of the via, however, a self-forming barrier 108 is present that is different from the EM blocking boundary 106.

Figure 2:
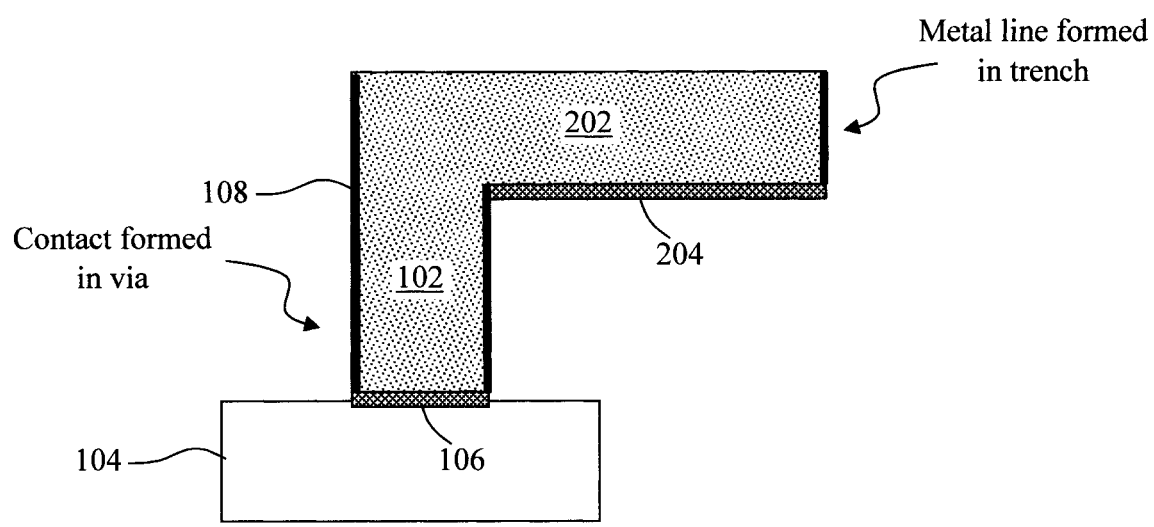
FIG. 2 is a cross-sectional diagram illustrating a metal line formed in a trench having a diffusion barrier layer formed on the trench bottom and a self-forming barrier formed along the sidewalls of the trench according to an embodiment of the present invention.

With metal lines, such as metal line 202 formed in a trench as shown in FIG. 2, electrons travel along the line but not through the trench bottom. In that case, a diffusion barrier layer 204 can be formed on the trench bottom using metals such as TaN and/or TiN. Along the sidewalls, however, the self-forming barrier 108 is present that is different from the diffusion barrier layer 204.

Figure 3:
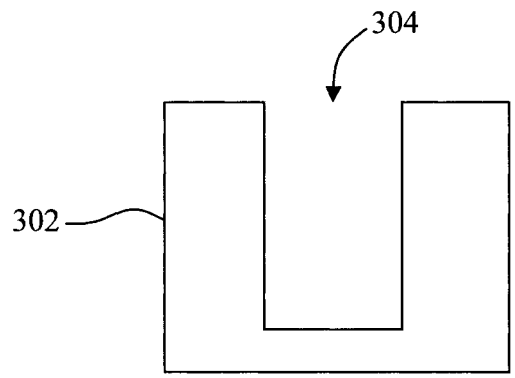
FIG. 3 is a cross-sectional diagram illustrating at least one feature having been patterned in a dielectric according to an embodiment of the present invention.
Figure 4:
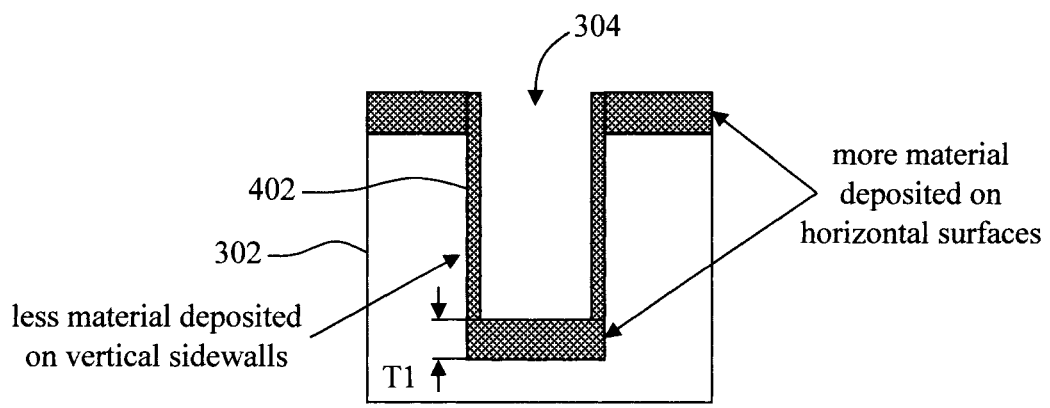
FIG. 4 is a cross-sectional diagram illustrating a conformal metal layer having been deposited into, and lining, the feature according to an embodiment of the present invention.

Given the above overview of the present techniques, an exemplary methodology for forming an interconnect structure is now described by way of reference to FIGS. 3-10. As shown in FIG. 3, the process begins with a dielectric 302. Suitable dielectrics 302 include, but are not limited to, oxide materials such as silicon oxide (SiOx) and/or organosilicate glass (SiCOH) and/or ultralow-κ interlayer dielectric (ULK-ILD) materials, e.g., having a dielectric constant K of less than 2.7. By comparison, silicon dioxide ($SiO_2$) has a dielectric constant κ value of 3.9. Suitable ultralow-κ dielectric materials include, but are not limited to, porous organosilicate glass (pSiCOH).

A damascene process will be employed to form at least one interconnect structure in the dielectric 302. Generally, a damascene process involves pattering a feature(s) (e.g., via and/or trench) in the dielectric 302, filling the feature(s) with a metal(s) and then polishing the deposited metal(s) to remove the overburden using, e.g., a process such as chemical-mechanical polishing (CMP). Thus, as shown in FIG. 3, at least one feature 304 is patterned in the dielectric 302. Standard lithography and etching techniques can be used to pattern feature 304 in the dielectric 302. A directional (anisotropic) etching process such as reactive ion etching (RIE) can be used for the trench etch.

Feature 304 is generally representative of the via or trench used in the formation of a contact or metal line, respectively. See above. Further, embodiments are contemplated herein whereby a 'dual damascene' process is used to pattern a monolithic via and trench structure, such as that shown in FIG. 2. In a dual damascene process, the via can be first patterned in the dielectric, followed by the trench. This approach is often referred to as a 'via first then trench process.' Alternatively, the trench can be first patterned in the dielectric, followed by the via. This approach is often referred to as a 'trench first then via process.' Both of these approaches are generally known in the art, and thus are not described in further detail herein.

A conformal metal layer 402 is then deposited into, and lining, the feature 304. See FIG. 4. Suitable materials for the metal layer 402 include, but are not limited to, TaN and/or TiN. According to an exemplary embodiment, metal layer 402 is formed using a directional deposition process whereby the material for metal layer 402 is deposited with a greater amount of the material being deposited on horizontal surfaces (including on a top surface of the dielectric 302 and at the bottom of feature 304), as compared to vertical surfaces (such as along sidewalls of feature 304). Thus, when an etch is used on the metal layer 402 (see below), the timing of the etch needed to remove the metal layer 402 from the vertical surfaces will leave the metal layer 402 present only on the top surface of the dielectric 302 and at the bottom of feature 304 since a greater amount of the liner material was deposited on these surfaces. By way of example only, a high-density plasma (HDP) chemical vapor deposition (CVD) or physical vapor deposition (PVD) process can be used for directional film deposition.

Figure 5:
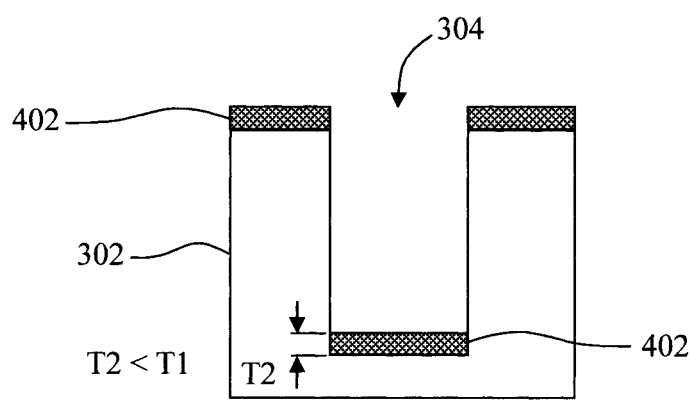
FIG. 5 is a cross-sectional diagram illustrating an etchback of the metal layer having been used to remove portions of the metal layer deposited on vertical sidewalls of the feature, whereby the metal layer remains on horizontal surfaces including a top surface of the dielectric and at a bottom of the feature according to an embodiment of the present invention.

As shown in FIG. 5, an etch-back of the metal layer 402 is then used to remove the portions of metal layer 402 deposited on the vertical sidewalls of feature 304. By way of this directional deposition and etch-back process, the metal layer 402 is selectively formed on the horizontal surfaces including the bottom of feature 304.

According to an exemplary embodiment, a non-directional (isotropic) etching process such as a wet chemical etch is used to remove metal layer 402 from the vertical sidewalls of feature 304. As provided above, a greater amount of the liner material can be deposited on the horizontal surfaces as compared to the vertical/sidewall surfaces. Thus, after removing the thinner portions of metal layer 402 deposited on the vertical sidewalls of feature 304, the metal layer 402 should remain on the horizontal surfaces as shown in FIG. 5. These horizontal surfaces include the top surface of the dielectric 302 and at the bottom of feature 304. Following the etch back, the metal layer 402 that remains on the horizontal surfaces has been thinned, e.g., from T1 to T2—compare FIG. 4 and FIG. 5, respectively. By way of example only, T1 is from about 10 nm to about 30 nm and ranges therebetween, and T2 is from about 2 nm to about 15 nm and ranges therebetween.

If a contact is formed in the feature 304 (e.g., via), then the metal layer 402 at the bottom of feature 304 can serve as an EM blocking boundary for electrons passing through the via bottom. On the other hand, if a metal line is formed in the feature 304 (e.g., trench), then the metal layer 402 at the bottom of feature 304 can serve as a diffusion barrier layer since electrons will travel along the metal line but not through the trench bottom.

Figure 6:
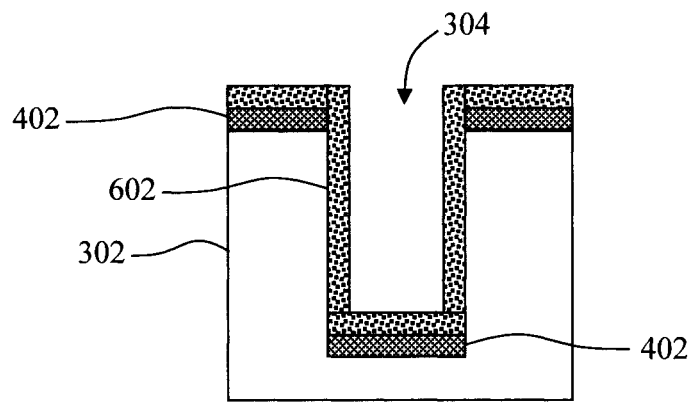
FIG. 6 is a cross-sectional diagram illustrating a conformal liner layer (formed from a metal alloy having a composition AB) having been deposited into, and lining, the feature according to an embodiment of the present invention.
Figure 7:
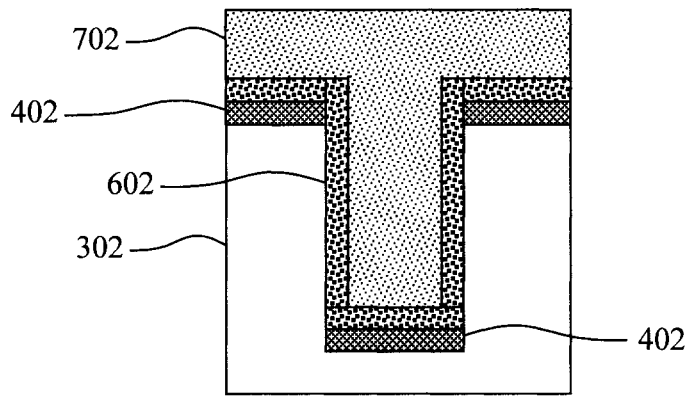
FIG. 7 is a cross-sectional diagram illustrating a metal having been deposited onto the liner layer, filling the feature, to form an interconnect structure according to an embodiment of the present invention.
Figure 8:
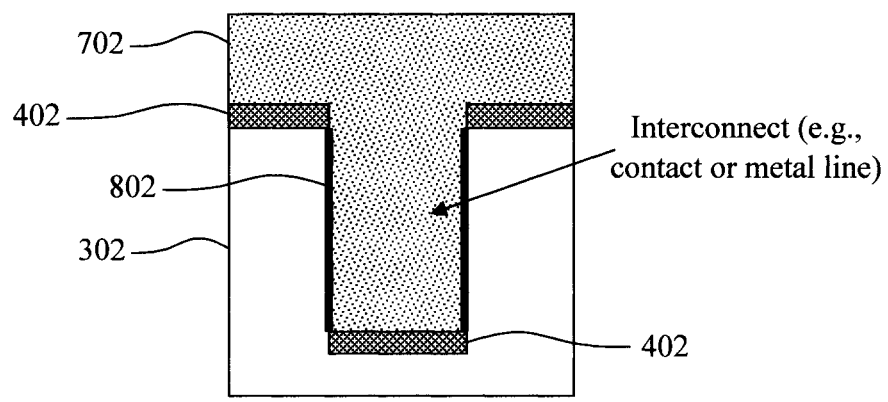
FIG. 8 is a cross-sectional diagram illustrating an anneal of the interconnect structure having been performed under conditions sufficient to form a barrier layer along the vertical sidewalls of the feature by diffusing constituent component B from the liner layer to a sidewall interface between the interconnect structure and the dielectric according to an embodiment of the present invention.

A self-forming barrier layer is then formed along the sidewalls of feature 304. To do so, a conformal liner layer 602 is deposited into, and lining, the feature 304. See FIG. 6. As shown in FIG. 6, liner layer 602 is disposed over the metal layer 402 along the horizontal surfaces (including at the bottom of feature 304) and in direct contact with dielectric 302 along the vertical sidewalls of feature 304.

According to an exemplary embodiment, liner layer 602 is formed from a metal alloy having a composition AB, wherein A is cobalt (Co), ruthenium (Ru), iridium (Ir), rhodium (Rh), nickel (Ni), tungsten (W) and/or platinum (Pt), and wherein B is manganese (Mn) and/or aluminum (Al). Liner layer 602 can be deposited using a process such as CVD or PVD. According to an exemplary embodiment, liner layer 602 has a thickness of from about 5 nanometers (nm) to about 20 nm and ranges therebetween.

A metal 702 is then deposited onto the liner layer 602, filling the feature 304. See FIG. 7. According to an exemplary embodiment, metal 702 includes at least one metal M selected from Co, Ru, Ir, Rh, Ni, W and/or Pt. Metal 702 can be deposited using a process such as CVD, PVD, electroplating, etc.

In one exemplary embodiment, the selection of the components of liner layer 602 and metal 702 occurs as follows: liner layer 602 includes one component A selected from Co, Ru, Ir, Rh, Ni, W and Pt, and one component B selected from Mn and Al. Thus, to use a simple non-limiting example, liner layer 602 can be an alloy of Co—Mn or Co—Al, Ru—Mn or Ru—Al, and so on. As is apparent from the description above, the component M for metal 702 is selected from the same group of metals as component A, e.g., Co, Ru, Ir, Rh, Ni, W and/or Pt. Preferably, the same metal is used as both the component M for metal 702 and the component A for the liner layer 602, i.e., A=M. Thus, to use a simple non-limiting example, if it is desired to form a Co interconnect structure then both A and M would be Co, for a Ru interconnect structure both A and M would be Ru, etc.

Depositing the metal 702 forms the interconnect structure, i.e., contact or metal line, in the feature 304, i.e., via or trench, respectively. However, a barrier is needed along the interconnect structure sidewall. To form the barrier, an anneal of the interconnect structure is next performed under conditions sufficient to form a barrier layer 802 along the vertical sidewalls of the feature 304 containing the component B (e.g., Mn or Al) by diffusing the constituent component B from the liner layer 602 to a sidewall interface between the interconnect structure and the dielectric 302. Once at this interface, the component B will react with silicon and oxygen from the dielectric 302 forming a silicate material as the barrier layer 802. See FIG. 8. For instance, if component B is Mn then the barrier layer 802 formed is manganese silicate ($MnSi_xO_y$), or if component B is Al then the barrier layer 802 formed is aluminum silicate ($AlSi_xO_y$), and so on.

Notably, as provided above, the constituent component A of the liner layer 602 can be the same as the deposited metal 702 (e.g., both A and M are Co, or both A and M are Ru, etc.). In that case, what remains of the liner layer 602 after the diffusion anneal is indistinguishable from the metal 702.

According to an exemplary embodiment, the conditions for the diffusion anneal include, but are not limited to, a temperature of from about 100° C. to about 400° C. and ranges therebetween, and a duration of from about 1 minute to about 300 minutes and ranges therebetween. According to an exemplary embodiment, the barrier layer 802 is formed having a thickness of from about 2 angstroms (Å) to about 40 Å and ranges therebetween. The thickness of barrier layer 802 can vary depending on the on the percentage of component B (e.g., Mn or Al) in the metal alloy AB. Due to the presence of the metal layer 402 which blocks diffusion of the component B, formation of the barrier layer 802 occurs only along the sidewalls of the interconnect structure where the liner layer 602 is in direct contact with the dielectric 302.

Figure 9:
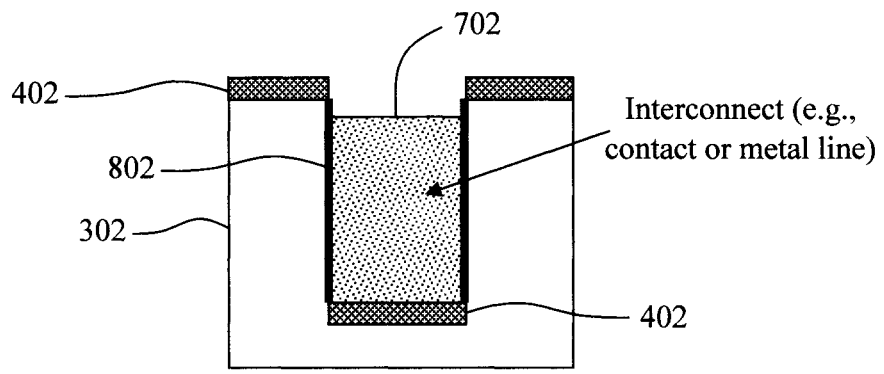
FIG. 9 is a cross-sectional diagram illustrating an overburden of the metal having been removed according to an embodiment of the present invention.

The overburden of metal 702 is then removed using, e.g., a polishing process such as CMP. See FIG. 9. As shown in FIG. 9, the metal layer 402 present on the top surface of dielectric 302 acts as an etch stop during this polishing process.

Figure 10:
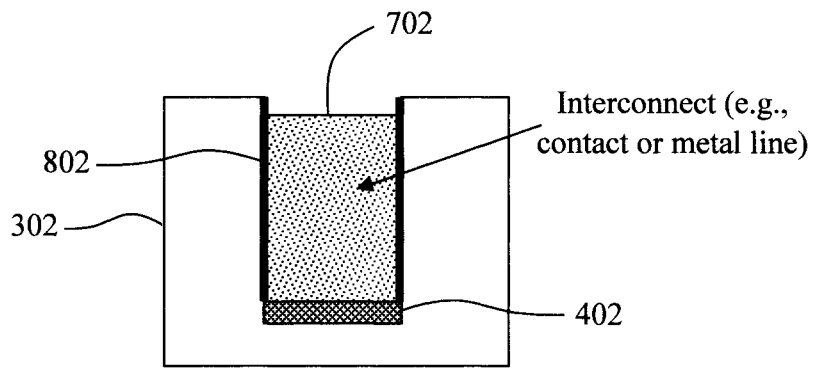
FIG. 10 is a cross-sectional diagram illustrating the metal layer present at the top surface of the dielectric having been removed according to an embodiment of the present invention.
Figure 11:
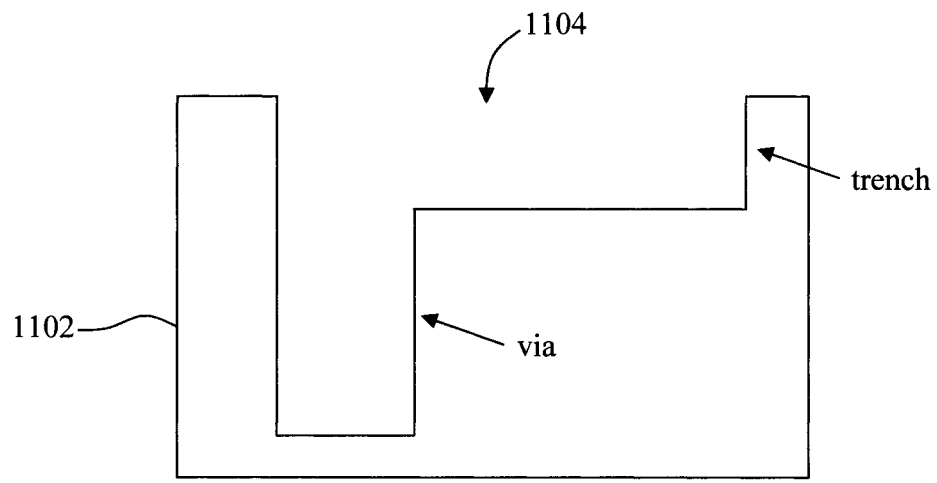
FIG. 11 is a cross-sectional diagram illustrating, according to an alternative embodiment, at least one feature having been patterned in a dielectric wherein the feature includes a via on the bottom and a trench on top of the via, aligned with the via, according to an embodiment of the present invention.
Figure 12:
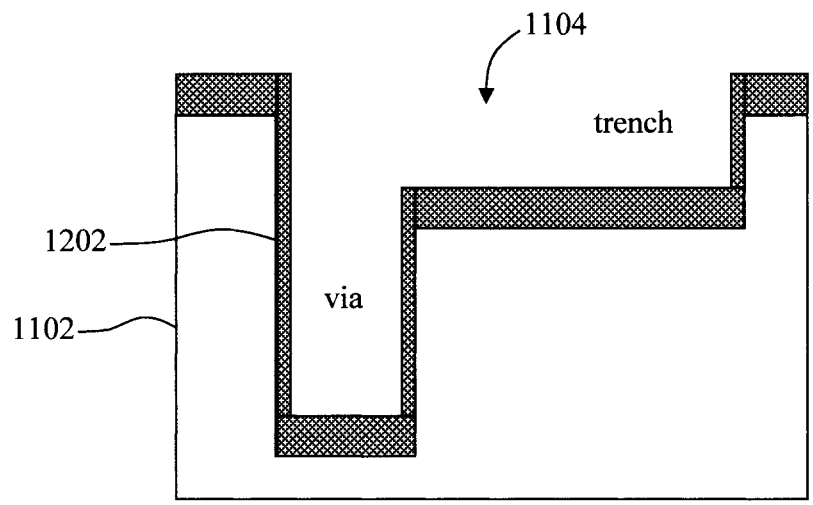
FIG. 12 is a cross-sectional diagram illustrating a conformal metal layer having been deposited into, and lining, the feature according to an embodiment of the present invention.

As shown in FIG. 10, the metal layer 402 present on the top surface of dielectric 302 is then removed using, e.g., a polishing process such as CMP or a wet chemical etch. The result is an interconnect structure formed, e.g., from Co, Ru, Ir, Rh, Ni, W and/or Pt with an EM blocking boundary/diffusion barrier layer (formed by metal layer 402) at the bottom of the interconnect, structure and a self-forming barrier layer 802 along the sidewalls of the interconnect structure.

As provided above, the present techniques can be implemented in a variety of different interconnect design configurations such as in the formation of contacts and metal lines as just described in previous example. By way of example only, the present techniques can also be implemented in the formation of dual damascene monolithic via and trench structures as illustrated in the following example described by way of reference to FIGS. 11-16.

In the same manner as above, the process begins with the patterning of at least one feature 1104 in a dielectric 1102. As provided above, suitable dielectrics include, but are not limited to, SiOx, SiCOH and/or pSiCOH. Standard lithography and etching techniques can be used to pattern feature 1104 in the dielectric 1102. In this example, feature 1104 includes a via on the bottom and a trench on top of the via, aligned with the via.

Figure 13:
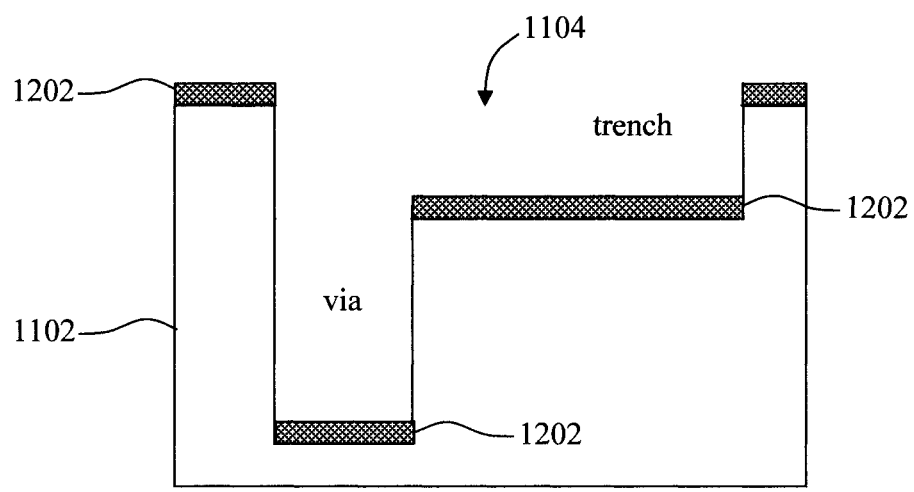
FIG. 13 is a cross-sectional diagram illustrating an etchback of the metal layer having been used to remove portions of the metal layer deposited on vertical sidewalls of the feature, whereby the metal layer remains on horizontal surfaces including a top surface of the dielectric and at bottoms of the via and trench according to an embodiment of the present invention.

As above, a metal layer is next selectively formed on the horizontal surfaces including the bottoms of the via and trench to serve as an EM blocking boundary/diffusion barrier layer. To do so, a conformal metal layer 1202 (e.g., TaN and/or TiN) is first deposited into, and lining, the feature 1104. See FIG. 12. A directional deposition process such as HDP CVD or PVD can be employed to deposit a greater amount of the metal layer 1202 on horizontal as opposed to vertical surfaces. Thus, as shown in FIG. 13, when an etch-back of the metal layer 1202 is performed, the thinner portions of metal layer 1202 deposited on the vertical sidewalls of feature 1104 will be removed while the thicker portions of the metal layer 1202 remain on the horizontal surfaces. As shown in FIG. 13, these horizontal surfaces include the top surface of the dielectric 1102 and at the bottoms of the via and trench.

Figure 14:
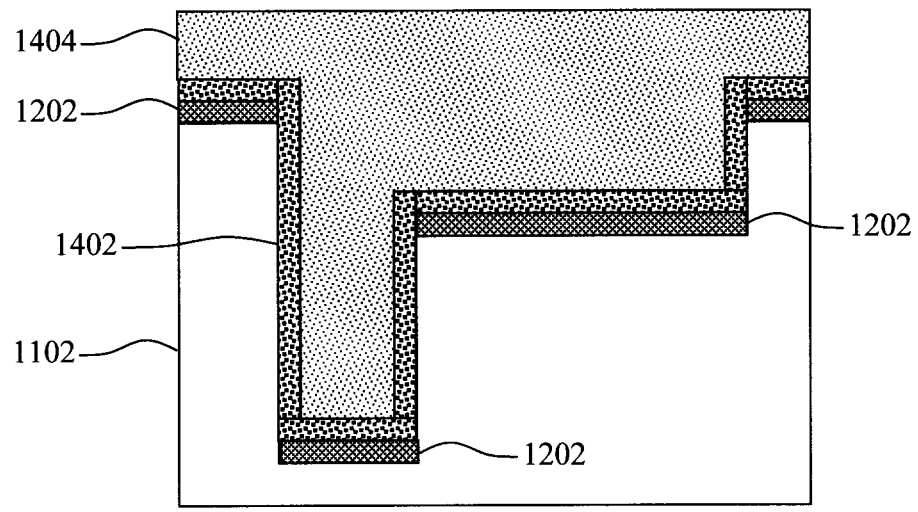
FIG. 14 is a cross-sectional diagram illustrating a conformal liner layer (formed from a metal alloy having a composition AB) having been deposited into the feature and lining the via and the trench, and a metal having been deposited into the feature over the liner layer, filling the via and trench, to form an interconnect structure including a contact in the via and a metal line in the trench according to an embodiment of the present invention.
Figure 15:
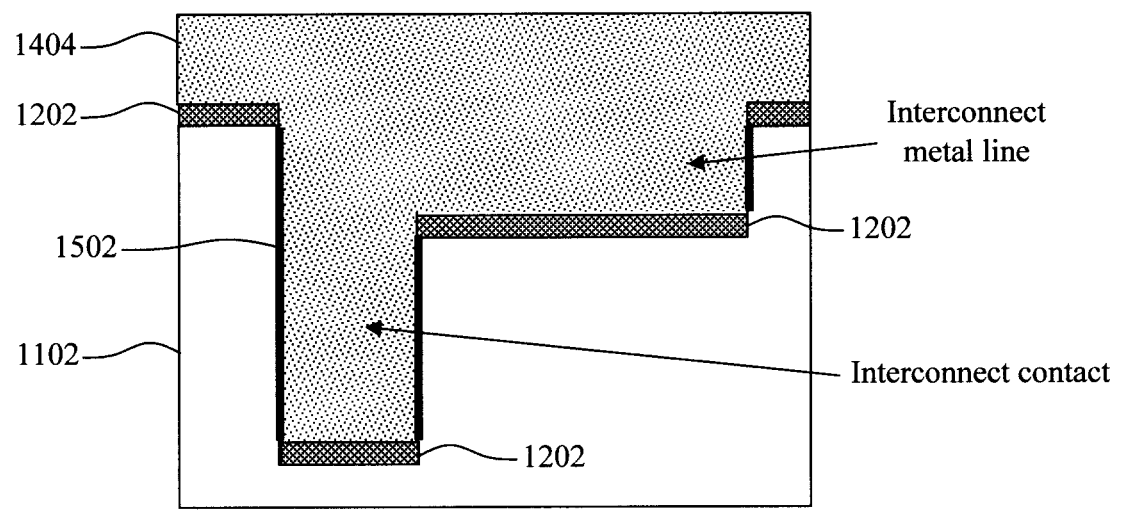
FIG. 15 is a cross-sectional diagram illustrating an anneal of the interconnect structure having been performed under conditions sufficient to form a barrier layer along the vertical sidewalls of the feature by diffusing the constituent component B from the liner layer to a sidewall interface between the contact/metal line and the dielectric according to an embodiment of the present invention.

A conformal liner layer 1402 is then deposited (e.g., by CVD or PVD) into feature 1104, lining the via and the trench. See FIG. 14. As shown in FIG. 14, liner layer 1402 is disposed over the metal layer 1202 along the horizontal surfaces (including at the bottom of via and trench) and in direct contact with dielectric 1102 along the vertical sidewalls of the via and trench. In the same manner as above, this liner layer 1402 will be used in creating a self-forming barrier layer along the sidewalls of the via and trench.

According to an exemplary embodiment, liner layer 1402 is formed from a metal alloy having a composition AB, wherein A is Co, Ru, Ir, Rh, Ni, W and/or Pt, and wherein B is Mn and/or Al. By way of example only, liner layer 1402 has a thickness of from about 5 nm to about 20 nm and ranges therebetween.

A metal 1404 is then deposited (e.g., by CVD, PVD, electroplating, etc.) into the feature 1104 over the liner layer 1402, filling the via and trench. According to an exemplary embodiment, metal 1404 includes at least one metal M selected from Co, Ru, Ir, Rh, Ni, W and/or Pt.

In one exemplary embodiment, the selection of the components of liner layer 1402 and metal 1404 occurs as follows: liner layer 1402 includes one component A selected from Co, Ru, Ir, Rh, Ni, W and Pt, and one component B selected from Mn and Al. Thus, to use a simple non-limiting example, liner layer 1402 can be an alloy of Co—Mn or Co—Al, Ru—Mn or Ru—Al, and so on. As is apparent from the description above, the component M for metal 1404 is selected from the same group of metals as component A, e.g., Co, Ru, Ir, Rh, Ni, W and/or Pt. Preferably, the same metal is used as both the component M for metal 1404 and the component A for the liner layer 1402, i.e., A=M. Thus, to use a simple non-limiting example, if it is desired to form a Co interconnect structure then both A and M would be Co, for a Ru interconnect structure both A and M would be Ru, etc.

Depositing metal 1404 into the feature 1104 forms an interconnect structure in the feature 1104, i.e., a contact in the via and a metal line in the trench. However, a barrier has yet to be formed along the sidewalls of this interconnect structure. To form the sidewall barrier, an anneal of the interconnect structure is next performed under conditions sufficient to form a barrier layer 1502 along the vertical sidewalls of the feature 1104 containing the component B (e.g., Mn or Al) by diffusing the constituent component B from the liner layer 1402 to a sidewall interface between the contact/metal line and the dielectric 1102. Once at this interface, the component B will react with silicon and oxygen from the dielectric 1102 forming a silicate material as the barrier layer 1502. See FIG. 15. For instance, if component B is Mn then the barrier layer 1502 formed is $MnSi_xO_y$, or if component B is Al then the barrier layer 1502 formed is $AlSi_xO_y$, and so on.

As provided above, the constituent component A of the liner layer 1402 can be the same as the deposited metal 1404 (e.g., both A and M are Co, or both A and M are Ru, etc.). In that case, what remains of the liner layer 1402 after the diffusion anneal is indistinguishable from the metal 1404.

According to an exemplary embodiment, the conditions for the diffusion anneal include, but are not limited to, a temperature of from about 100° C. to about 400° C. and ranges therebetween, and a duration of from about 1 minute to about 300 minutes and ranges therebetween. According to an exemplary embodiment, the barrier layer 1502 is formed having a thickness of from about 2 Å to about 40 Å and ranges therebetween. Due to the presence of the metal layer 1202 which blocks diffusion of the component B, formation of the barrier layer 1502 occurs only along the sidewalls of the interconnect structure where the liner layer 1402 is in direct contact with the dielectric 1102.

Figure 16:
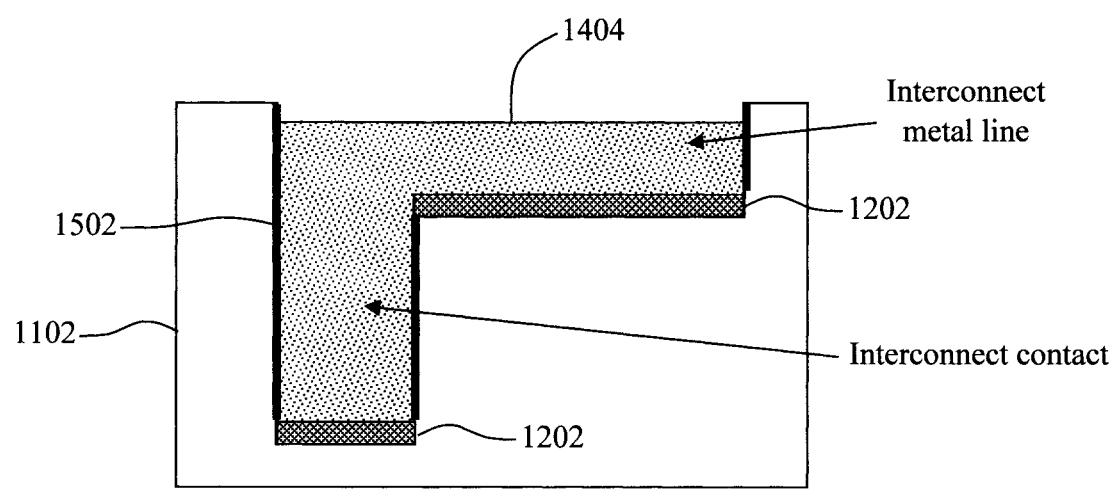
FIG. 16 is a cross-sectional diagram illustrating an overburden of the metal having been removed, followed by removal of the metal layer from the top surface of dielectric according to an embodiment of the present invention.

The overburden of metal 1404 is then removed, followed by removal of the metal layer 1202 from the top surface of dielectric 1102. See FIG. 16. As provided above, a process such as CMP and/or wet chemical etching can be employed. As shown in FIG. 16, the result is an interconnect structure (i.e., contact and metal line) formed, e.g., from Co, Ru, Ir, Rh, Ni, W and/or Pt with an EM blocking boundary/diffusion barrier layer (formed by metal layer 1202) at the bottoms of the contact and metal line, and a self-forming barrier layer 1502 along the sidewalls of the contact and metal line.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming an interconnect structure, the method comprising the steps of:
   patterning at least one feature in a dielectric;
   selectively forming a metal layer on horizontal surfaces, including at a bottom of the at least one feature;
   depositing a conformal liner layer into, and lining, the at least one feature that is in direct contact with the dielectric along vertical sidewalls of the at least one feature, wherein the conformal liner layer comprises a metal alloy AB, wherein component A is selected from the group consisting of: cobalt (Co), ruthenium (Ru) iridium (Ir), rhodium (Rh), nickel (Ni), tungsten (W), platinum (Pt), and combinations thereof, and wherein component B is selected from the group consisting of: manganese (Mn), aluminum (Al), and combinations thereof;
   depositing a metal onto the conformal liner layer, filling the at least one feature, to form the interconnect structure in the at least one feature, wherein the metal comprises at least one metal M selected from the group consisting of: Co, Ru, Ir, Rh, Ni, W, Pt, and combinations thereof; and
   annealing the interconnect structure under conditions sufficient to form a barrier layer comprising the component B along the vertical sidewalls of the at least one feature by diffusing the component B from the conformal liner layer to a sidewall interface between the interconnect structure and the dielectric.

2. The method of claim 1, wherein the at least one feature is selected from the group consisting of: a via, a trench, and combinations thereof.

3. The method of claim 1, wherein the at least one feature comprises a via and a trench, on top of the via, aligned with the via.

4. The method of claim 1, wherein the dielectric is selected from the group consisting of: silicon oxide (SiOx), organosilicate glass (SiCOH), porous organosilicate glass (pSiCOH), and combinations thereof.

5. The method of claim 1, wherein the metal layer comprises a material selected from the group consisting of: tantalum nitride (TaN), titanium nitride (TiN), and combinations thereof.

6. The method of claim 1, wherein the step of selectively forming the metal layer comprises the steps of:
depositing the metal layer using a conformal deposition process with a greater amount of the metal layer being deposited on the horizontal surfaces than on vertical surfaces; and
etching back the metal layer to remove the metal layer from the vertical surfaces.

7. The method of claim 1, wherein a same metal is used as both the at least one metal M and the component A.

8. The method of claim 1, wherein the barrier layer comprises manganese silicate (MnSixOy) or aluminum silicate (AlSixOy).

9. The method of claim 1, wherein the conditions comprise a temperature and a duration.

10. The method of claim 9, wherein the temperature is from about 100° C. to about 400° C. and ranges therebetween.

11. The method of claim 9, wherein the duration is from about 1 minute to about 300 minutes and ranges therebetween.

12. The method of claim 1, further comprising the step of:
removing an overburden of the metal using at least one of: chemical-mechanical polishing (CMP) and wet chemical etching.

13. A method of forming an interconnect structure, the method comprising the steps of:
patterning at least one feature in a dielectric, wherein the at least one feature comprises a via and a trench, on top of the via, aligned with the via;
selectively forming a metal layer on horizontal surfaces, including at bottoms of the via and the trench;
depositing a conformal liner layer into the at least one feature, lining the via and the trench, that is in direct contact with the dielectric along vertical sidewalls of the via and the trench, wherein the conformal liner layer comprises a metal alloy AB, wherein component A is selected from the group consisting of: Co, Ru, Ir, Rh, Ni, W, Pt, and combinations thereof, and wherein component B is selected from the group consisting of: Mn, Al, and combinations thereof;
depositing a metal onto the conformal liner layer, filling the via and the trench, to form the interconnect structure in the at least one feature comprising a contact in the via and a metal line in the trench, wherein the metal comprises at least one metal M selected from the group consisting of: Co, Ru, Ir, Rh, Ni, W, Pt, and combinations thereof; and
annealing the interconnect structure under conditions sufficient to form a barrier layer comprising the component B along the vertical sidewalls of the at least one feature by diffusing the component B from the conformal liner layer to a sidewall interface between the contact and the metal line and the dielectric.

14. The method of claim 13, wherein the dielectric is selected from the group consisting of: SiOx, SiCOH, pSiCOH, and combinations thereof.

15. The method of claim 13, wherein the metal layer comprises a material selected from the group consisting of: TaN, TiN, and combinations thereof.

16. The method of claim 13, wherein the step of selectively forming the metal layer comprises the steps of:
depositing the metal layer using a conformal deposition process with a greater amount of the metal layer being deposited on the horizontal surfaces than on vertical surfaces; and
etching back the metal layer to remove the metal layer from the vertical surfaces.

17. The method of claim 13, wherein the barrier layer comprises MnSixOy or AlSixOy.

18. The method of claim 13, wherein the conditions comprise a temperature of from about 100° C. to about 400° C. and ranges therebetween, and a duration of from about 1 minute to about 300 minutes and ranges therebetween.

* * * * *